Aug. 6, 1963 J. C. MARINACE ET AL 3,100,166

FORMATION OF SEMICONDUCTOR DEVICES

Filed June 13, 1960

INVENTORS
JOHN C. MARINACE
RICHARD F. RUTZ

BY John F. Ohlandt Jr.
ATTORNEY 3,100,166

FORMATION OF SEMICONDUCTOR DEVICES

John C. Marinace, Yorktown Heights, and Richard F. Rutz, Fishkill, N.Y., assignors to International Business Machines Corporation, New York, N.Y., a corporation of New York Filed June 13, 1960, Ser. No. 35,804
1 Claim. (Cl. 148—1.5)

This invention relates to the formation of semiconductor bodies and in particular to an improved process for making semiconductor junction devices of the type known in the art as Esaki or tunnel diodes.

Semiconductor bodies for devices have been fabricated by the technique of vapor deposition wherein semiconductor material is deposited on a monocrystalline substrate in such a manner that the deposit has the same atomic periodicity and orientation as the substrate. The deposit is then referred to as epitaxial. Deposition on the substrate is generally accomplished by a disproportionation reaction involving the decomposition of a halide compound of the semiconductor material in vapor form.

The advantages attendant the vapor deposition technique, particularly the ease of broad area fabrication and the capability of producing deposits in discrete zones by masking of the substrate to thus form device arrays, are of special moment to the consideration of a new and interesting element, the Esaki diode, for use in computers.

The Esaki or tunnel diode is a device having regions of degenerately-doped semiconductor material with a sufficiently abrupt junction between regions so that the device exhibits the quantum-mechanical tunneling effect. A description of the various phenomena associated with this type of diode first appeared in a letter by Leo Esaki to the editor of the Physical Review of January 1958, page 603. The voltage-current characteristic of the Esaki diode exhibits in the forward direction first and second positive resistance regions separated by a transitional negative resistance region. The presence of the negative resistance region is important for amplifier, logical circuit and memory applications. The peak current of an Esaki diode is defined as the highest value which the current reaches in the first positive resistance region and the valley current is defined as the lowest value of current in the second positive resistance region.

The vapor deposition technique previously referred to has recently been successfully extended to the fabrication of Esaki diodes. In the actual process of making these devices, after an epitaxial deposit has been formed on the substrate, it is only necessary to attach ohmic contacts by soldering or low temperature alloying to each member of the junction. Normally, the minimum amount of heat possible has been employed in this step of the operation since the generally observed behavior with respect to alloyed Esaki diodes has been that greater time and temperature cycles reduce the peak to valley current ratios.

What has been discovered is that with vapor deposited Esaki diodes increased peak to valley current ratios are obtained when heat is applied for a certain optimum time greater than the minimum normally employed, in apparently complete contradiction to the generally observed phenomenon with respect to alloyed Esaki diodes. It has also been found that improved ratios of capacitance to peak current are obtained when a heat treatment is used.

Investigation of this unexpected result has been carried on and an example of actual measurements taken in an experimental run are tabulated hereinafter.

It is an object of the present invention to provide an improved process for the formation of Esaki diodes.

Another object is to produce vapor deposited Esaki diodes exhibiting high ratios of peak to valley current.

A further object is to produce vapor deposited Esaki diodes having low ratios of capacitance to peak current.

The foregoing and other objects, features and advantages of the present invention will be apparent from the following more particular description of a preferred embodiment of the invention, as illustrated in the accompanying drawing.

Figure 1:
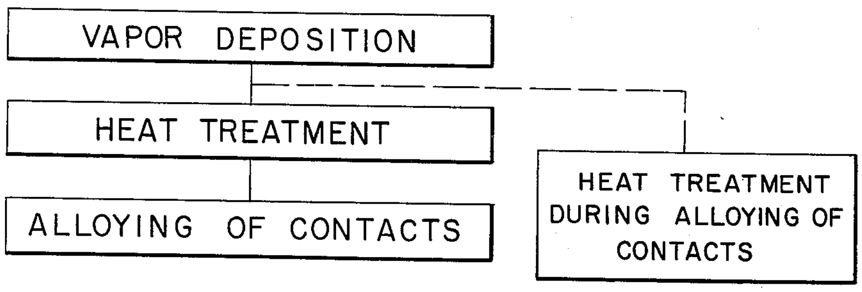
FIG. 1 is a flow diagram illustrating several ways of utilizing the technique of the present invention.

Referring now to FIG. 1, the box labelled "vapor deposition" represents the steps carried out in accordance with the technique previously described in application Serial No. 863,318, filed December 31, 1959, and assigned to the assignee of the present invention. With this technique a transport element is introduced into a container wherein a source of highly doped semiconductor material and a substrate of highly but oppositely doped material are positioned at separate zones which are heated to different temperatures. The source material and transport element combine to form a vaporized compound which diffuses and moves by convection to the cooler substrate zone where it decomposes yielding free semiconductor material which deposits epitaxially on the substrate. The PN junction element thus formed, because of the high doping involved, is of the type exhibiting the quantum-mechanical tunnelling effect. An illustration of the current-voltage characteristic curve of such a PN junction is given in FIG. 2.

After the vapor deposition has been accomplished, the PN junction is subjected to a heat treatment in either of the ways illustrated in FIG. 1. The junction is either first heated at a selected high temperature for a certain period and then contacts are attached by the usual low temperature alloying procedure or the alloying of contacts is accomplished at a high temperature so that the beneficial heat treatment is simultaneously effected. In either case the precise required time-temperature cycle may be readily determined empirically.

Figure 2:
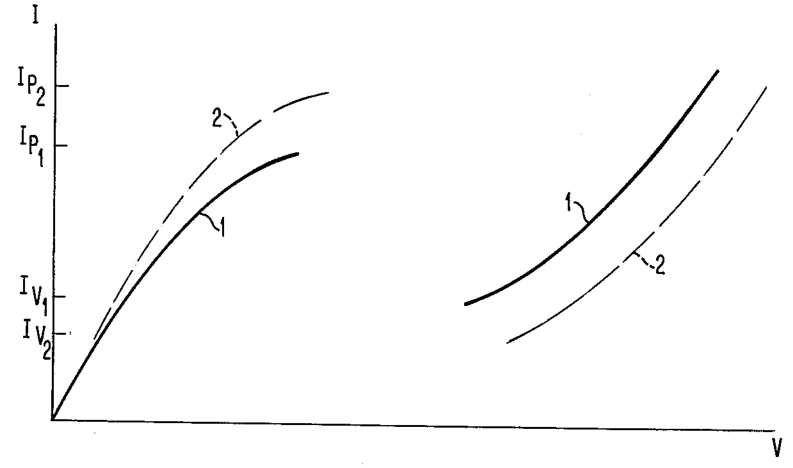
FIG. 2 is a plot of the voltage-current characteristic of a typical Esaki diode.

Referring now to FIG. 2, there is shown a voltage-current characteristic curve 2 (in dotted lines) which by comparison with curve 1 illustrates the improved peak to valley current ratio obtainable by the heat treatment of the present invention.

The exact mechanism which, in accordance with the teaching of the present invention, produces the superior PN junction of the Esaki diode type is not thoroughly understood. It is believed that lattice imperfections at the interface cause a lower effective concentration of the impurities in an area adjacent to the interface, that is, due to crystallographic defects, the effect of the impurities present is diminished and the tunneling process is therefore impaired.

Figure 3:
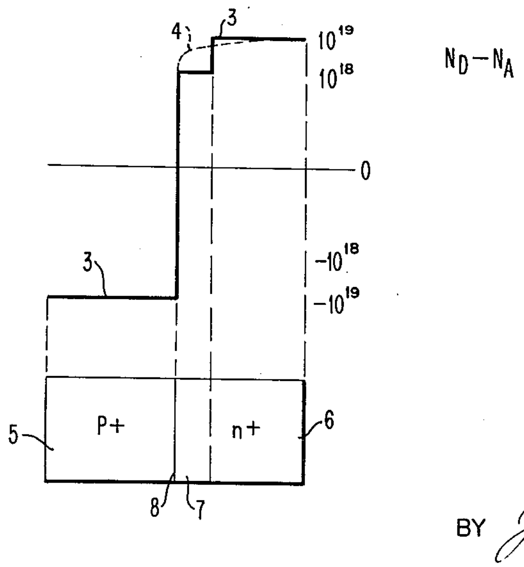
FIG. 3 is a sketch of a semiconductor crystal containing a PN junction accompanied by a dimensionally correlated plot of the effective net impurity concentrations.

This hypothesized phenomenon is graphically indicated in FIG. 3 wherein the curve 3 indicates the net concentration of impurities along the junction element. $N_D$ represents the concentration of donor type impurities and $N_A$ the concentration of acceptor type impurities. In the substrate P region 5, the acceptor type impurities predominate so that the curves are shown below the axis.

As may be seen in FIG. 3, the curve 3 indicates a sharp drop in the net concentration of impurities throughout the area 7, adjacent to the junction 8, in the deposited N region 6 due to the lattice imperfections alluded to above. When the junction element is heat treated, however, it is believed that there is an "annealing out" of the imperfections and the impurities present then become more effective in the tunnelling process. This greater effectiveness is illustrated by the curve 4 in FIG. 3 which shows a concentration of impurities in area 7 higher than that indicated by curve 3.

In an experimental run designed to investigate the unexpected result of higher peak to valley current ratios, groups of vapor deposited germanium junction elements were heat treated at 665° C. for different time periods. The values obtained of the significant parameters are given in the table below:

*Table I.—Heat treatment Effect on Vapor Grown Esaki Diodes*

| Group | $I_p/I_v$ | $I_p$(amp.)/ area (cm.$^2$) | C ($\mu$farads)/ area (cm.$^2$) | C ($\mu$ farads)/$I_p$ (amp.) |
|---|---|---|---|---|
| No heat treatment | 3/2 | 900 | [1] 9 | [1] .01 |
| 20 seconds at 665° C | 3 | 1,500 | 4.5 | .003 |
| 1 minute at 665° C | 3 | 1,000 | [1] 7 | [1] .007 |
| 10 minutes at 665° C | 5/2 | 200 | 2 | .01 |

[1] Estimated.

It will be appreciated by those skilled in the art that the tempearture and time periods given above are merely exemplary and that these factors may be individually varied since it is the combination of time and temperature that produces the desired effects.

It will be understood that the disclosed technique is also applicable to Esaki diodes formed of semiconductor materials other than germanium. In another experimental run, for example, germanium was deposited epitaxially on a gallium arsenide substrate and the junction element thus formed was subjected to a heat treatment. Results similar to those evidenced by Table I above were obtained.

What has been achieved by the simple heat treatment technique of the present invention is a superior vapor depositied junction device of the Esaki diode type since a high ratio of peak to valley current, generally accepted as a quality criterion in the art, is exhibited by the device. A concomitant effect, also accepted as a quality criterion, is a low ratio of capacitance to peak current. Additionally, it allows one to control the capacitance/unit area in a systematic way. A practical result is that the heat treatment techniques relaxes the substrate surface requirements for vapor depositing good tunnelling junctions.

While the invention has been particularly shown and described with reference to a preferred embodiment thereof, it will be understood by those skilled in the art that various changes in form and details may be made therein without departing from the spirit and scope of the invention.

What is claimed is:

A process of fabricating a semiconductor junction device of the type known as an Esaki or tunnel diode by vapor deposition comprising the steps of: decomposing a gaseous semiconductor halide compound of one conductivity type over a substrate of semiconductor material of opposite conductivity type to produce an expitaxial deposition on said substrate; and applying heat to the P-N junction device thus formed for a time period of approximately 20 seconds at a temperature of approximately 665° C., thereby to produce an optimum ratio of capacitance to peak current for said device.

References Cited in the file of this patent

UNITED STATES PATENTS

| | | |
|---|---|---|
| 2,692,839 | Christensen et al. | Oct. 26, 1954 |
| 2,694,168 | North et al. | Nov. 9, 1954 |
| 2,845,374 | Jones | July 29, 1958 |
| 2,861,229 | Pankove | Nov. 18, 1958 |

OTHER REFERENCES

Semiconductors, Hannay, Reinhold Publishing Corporation, New York, 1959; pp 535–536 relied on.